United States Patent
Kwon

(10) Patent No.: US 9,202,865 B2
(45) Date of Patent: Dec. 1, 2015

(54) SEMICONDUCTOR DEVICE INCLUDING A WALL OXIDE FILM AND METHOD FOR FORMING THE SAME

(71) Applicant: SK hynix Inc., Icheon-si (KR)

(72) Inventor: Se In Kwon, Incheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/242,102

(22) Filed: Apr. 1, 2014

(65) Prior Publication Data

US 2015/0108601 A1  Apr. 23, 2015

(30) Foreign Application Priority Data

Oct. 17, 2013 (KR) .......................... 10-2013-0123944

(51) Int. Cl.
| | |
|---|---|
| *H01L 29/06* | (2006.01) |
| *H01L 21/762* | (2006.01) |
| *H01L 27/092* | (2006.01) |
| *H01L 29/66* | (2006.01) |

(52) U.S. Cl.
CPC ...... *H01L 29/0649* (2013.01); *H01L 21/76224* (2013.01); *H01L 27/092* (2013.01); *H01L 29/66* (2013.01)

(58) Field of Classification Search
CPC ... H01L 29/7843; H01L 29/78; H01L 27/092; H01L 29/66
USPC ................................................ 257/374, 506
See application file for complete search history.

(56) References Cited

U.S. PATENT DOCUMENTS

| | | | | |
|---|---|---|---|---|
| 5,661,329 | A | * | 8/1997 | Hiramoto et al. ............. 257/510 |
| 6,570,217 | B1 | * | 5/2003 | Sato et al. ...................... 257/327 |
| 6,989,552 | B2 | * | 1/2006 | Goodwin et al. ............... 257/69 |
| 7,071,515 | B2 | * | 7/2006 | Sheu et al. ..................... 257/374 |
| 7,190,036 | B2 | * | 3/2007 | Ko et al. ........................ 257/374 |
| 2006/0088965 | A1 | | 4/2006 | Yang |
| 2006/0220144 | A1 | | 10/2006 | Anezaki et al. |
| 2007/0278592 | A1 | * | 12/2007 | Tu et al. ........................ 257/374 |
| 2009/0085146 | A1 | * | 4/2009 | Aoki ............................. 257/492 |
| 2010/0055866 | A1 | * | 3/2010 | Choi ............................. 438/424 |
| 2013/0082312 | A1 | * | 4/2013 | Hung et al. ................... 257/292 |
| 2013/0292761 | A1 | * | 11/2013 | Yeh et al. ...................... 257/334 |
| 2014/0225219 | A1 | * | 8/2014 | Huang et al. ................. 257/510 |
| 2015/0054032 | A1 | * | 2/2015 | Loubet et al. ................. 257/192 |

FOREIGN PATENT DOCUMENTS

KR  10-2006-0036547 A  5/2006

\* cited by examiner

*Primary Examiner* — Nathan Ha

(57) ABSTRACT

A semiconductor device includes an oxide film structure having different thicknesses depending on where the oxide film structure is formed. In the semiconductor device, a wall oxide film is formed to have different thicknesses depending on locations of sidewalls of an active region. The semiconductor device includes an active region, a first wall oxide film disposed over a first sidewall of the active region that extends along a first direction of the active region, the first wall oxide film having a first thickness, and a second wall oxide film disposed over a second sidewall of the active region that extends along a second direction of the active region, a second wall oxide film having a second thickness that is different from the first thickness.

15 Claims, 7 Drawing Sheets

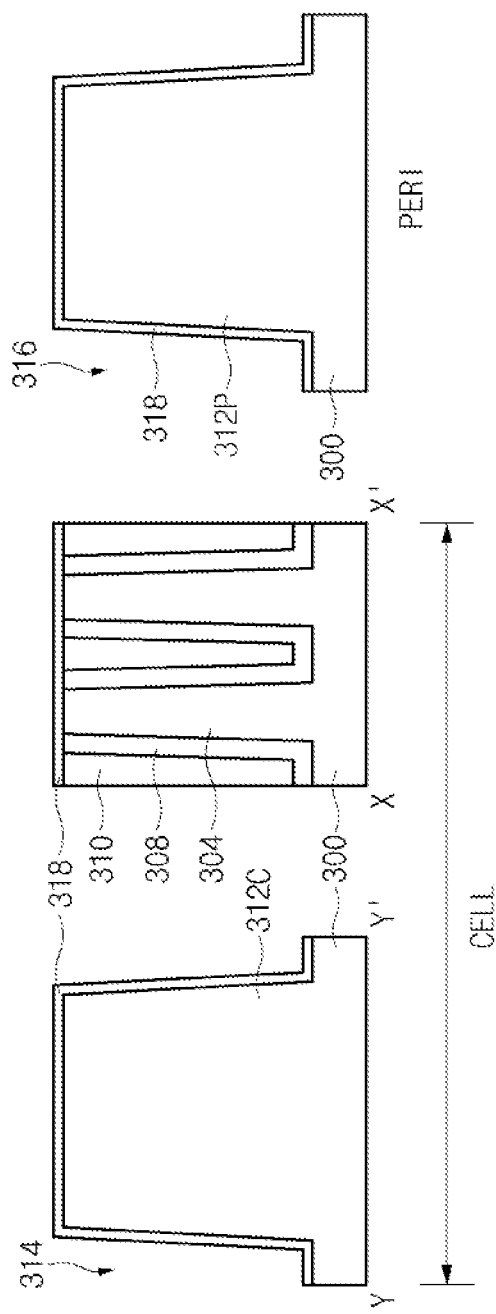

SEMICONDUCTOR DEVICE INCLUDING A WALL OXIDE FILM AND METHOD FOR FORMING THE SAME

CROSS-REFERENCE TO RELATED APPLICATION

The present application claims priority to Korean Patent Application No. 10-2013-0123944, filed on 17 Oct. 2013, the disclosure of which is incorporated herein in its entirety by reference.

BACKGROUND

Embodiments of the present invention relate to a semiconductor device, and more particularly, to a semiconductor device in which a wall oxide film (also called a sidewall oxide film) is formed to have different thicknesses depending on the location of the sidewall, and a method for forming the same.

As the degree of integration of semiconductor devices increases, the area of a pattern formed over an active region of a semiconductor substrate has been reduced, and the area of a device isolation region formed to prevent the occurrence of electric connection between patterns has been reduced.

A conventional device isolation region had been formed through a local oxidation of silicon (LOCOS) process. As the device isolation region has been gradually reduced in size, a shallow trench isolation (STI) process capable of forming a superior small-sized device isolation region has been developed as an alternative to the LOCOS process.

In the STI process, after a trench having a predetermined depth is formed in a semiconductor substrate, an insulation material is deposited to fill the trench, and then any unnecessary insulation film is removed through a CMP process. As a result, a device isolation region for electrically isolating active regions from each other is formed.

However, as a design rule is gradually reduced, the aspect ratio of a trench is gradually increased, such that a wall oxide film formed over a sidewall of a device isolation trench becomes thinner in thickness.

In addition, as a gate of the semiconductor device is repeatedly turned on/off, a disturbance may be caused by the voltage applied to the gate for the on/off operation. This disturbance may manifest in different ways depending on the location of the gate. For example, a disturbance caused by a neighbor gate (NG), which is shared by neighboring active regions, is different from a disturbance caused by a passing gate (PG), which is formed to pass by an active region.

As a result, a method for solving both NG-based disturbances and PG-based disturbances is in demand.

SUMMARY

Various embodiments of the present invention are directed to a semiconductor device having a wall oxide film structure and a method for forming the same, which substantially obviate one or more problems due to limitations and disadvantages of the related art.

An embodiment of the present invention relates to a semiconductor device in which a wall oxide film is formed to have different thicknesses depending on the locations of the sidewalls in an active region. As a result, a disturbance caused by a gate that is repeatedly turned on/off can be improved.

In accordance with an aspect of the present invention, a semiconductor device includes: an active region; and a wall oxide film disposed over the active region, wherein the wall oxide film has different thicknesses, a thickness of the wall oxide film depending on a location of the sidewall over which the wall oxide film is disposed.

In accordance with another aspect of the present invention, a method for forming a semiconductor device having a multi-type wall oxide film includes: forming a first trench defining a line-type partition pattern by etching a semiconductor substrate; forming a first wall oxide film having a first thickness over the first trench; forming a first device isolation film over the first wall oxide film by filling the first trench; forming a second trench defining an active region by dividing the partition pattern into a plurality of unit portions; forming a second wall oxide film having a second thickness on a sidewall of the second trench, the second thickness being different from the first thickness; and forming a second device isolation film by filling a portion of the second trench that remains after the formation of the second wall oxide film.

It is to be understood that both the foregoing general description and the following detailed description of embodiments are not limiting, but are intended to provide further explanation of the invention as claimed.

BRIEF DESCRIPTION OF THE DRAWINGS

FIGS. 3a to 3e are cross-sectional views illustrating a method of forming a structure shown in FIG. 2 and a structure of a peripheral (peri) region.

DESCRIPTION OF EMBODIMENTS

Reference will now be made in detail to certain embodiments and examples which are illustrated in the accompanying drawings. Wherever possible, the same reference numbers will be used throughout the drawings to refer to the same or like parts. In the following description, a detailed description of well-known configurations or functions may be omitted.

Figure 1:
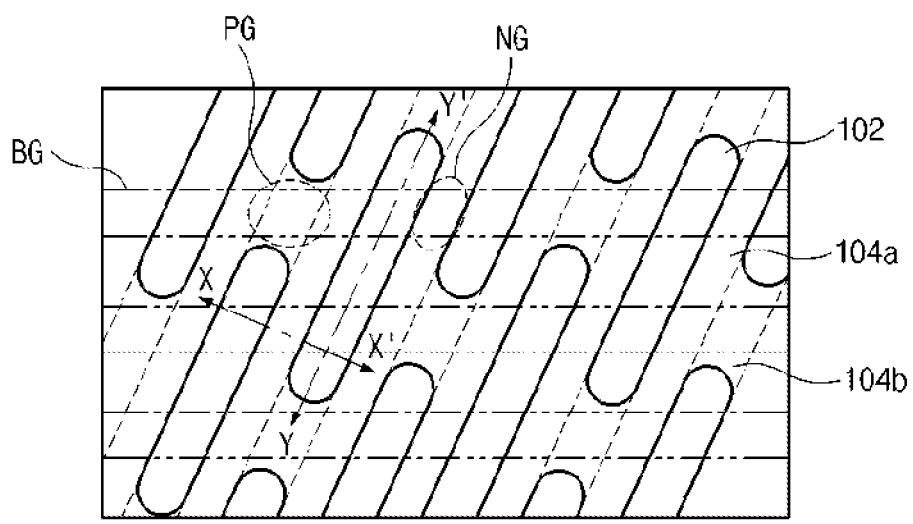
FIG. 1 illustrates a plan view of a semiconductor device according to an embodiment.
Figure 2:
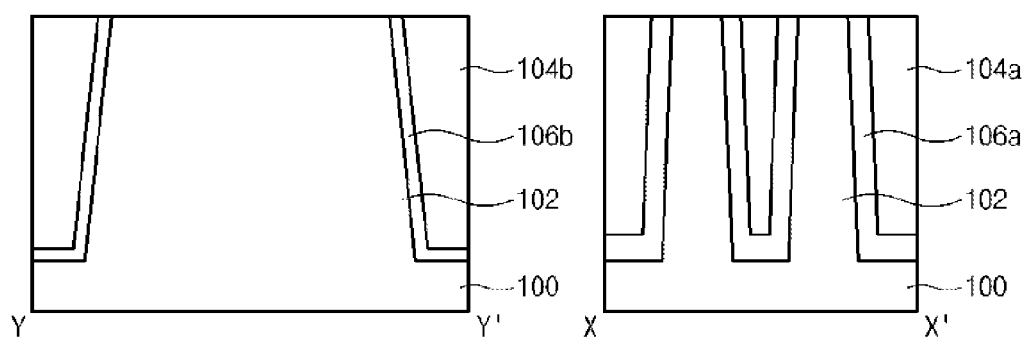
FIG. 2 illustrates cross-sectional views of the semiconductor device taken along lines X-X' and Y-Y' of FIG. 1.

FIG. 1 illustrates a plan view of a semiconductor device according to an embodiment. FIG. 2 illustrates cross-sectional views of the semiconductor device taken along lines X-X' and Y-Y' of FIG. 1.

Referring to FIGS. 1 and 2, the semiconductor device has a $6F^2$ structure in which an active region 102, defined by device isolation films 104a and 104b, is not perpendicular to a gate (word line) (BG). The active region 102 is tilted at a predetermined angle other than a right angle with respect to the gate (word line) (BG).

Wall oxide films 106a and 106b are formed over sidewalls of the active region 102 and at the bottom of a trench provided between active regions 102. The wall oxide films 106a and 106b have different thicknesses depending on the positions of the sidewalls. For example, a thick wall oxide film 106a is formed over the bottom and sidewalls of the active region 102 that are parallel to a long-axis (i.e., Y-axis corresponding to the line Y-Y' in FIG. 1 of the active region 102. That is, the thick wall oxide film 106a, which is formed over surfaces that extend parallel to the Y-axis, is formed between active regions 102 that are adjacent to each other (or that neighbor each other) along the direction of the X-axis. In other words, the thick wall oxide film 106a is formed over a sidewall of the active region 102 that is adjacent to a neighbor gate (NG) shared by neighboring active regions.

In contrast, a thin wall oxide film 106b is formed over the bottom and the sidewalls of the active region 102 that are substantially parallel to a short-axis (i.e., X-axis, corresponding to the line X-X' in FIG. 1) of the active region 102. That is, the thin wall oxide film 106b is formed between active regions 102 that are adjacent to each other (or that neighbor each other) along the direction of the Y-axis. In other words, the thin wall oxide film 106b is formed over a sidewall of the active region 102 that is adjacent to a passing gate (PG) passing by the active region 102.

In an embodiment, each of the wall oxide films 106a and 106b includes a high temperature oxide (HTO) film having superior step coverage. After formation of the HTO film, a dry oxidation process may be performed to cure a substrate etched (or damaged) in an etch process for forming a trench for the device isolation.

Subsequently, a first line-type device isolation film 104a extending along a line that is parallel to the long-axis (i.e., Y-axis) of the active region 102 is formed in a space between the wall oxide films 106a, i.e., in a space between active regions that are adjacent along a direction of the short-axis (i.e., X-axis) of the active region 102. In addition, a second island-type device isolation film 104b is formed in a space between the wall oxide films 106b, i.e., in a space between active regions that are adjacent along a direction of the long-axis (i.e., Y-axis) of the active region 102.

In an embodiment, the first device isolation film 104a includes a nitride film, and the second device isolation film 104b includes an oxide film. As described above, the nitride film, serving as the first device isolation film 104a, is formed between the thick wall oxide films 106a so as to reduce the size of a region in which the nitride film is formed. As a result, a charge trap caused by the nitride film can be improved. In addition, the oxide film, serving as the second device isolation film 104b, is formed between the wall oxide films 106b, and thus tensile stress is applied to a channel. As a result, an operation current of the semiconductor device is improved.

FIGS. 3a to 3e are cross-sectional views illustrating a method of forming a structure shown in FIG. 2 and a structure of a peripheral (peri) region of the semiconductor device.

Figure 3A:
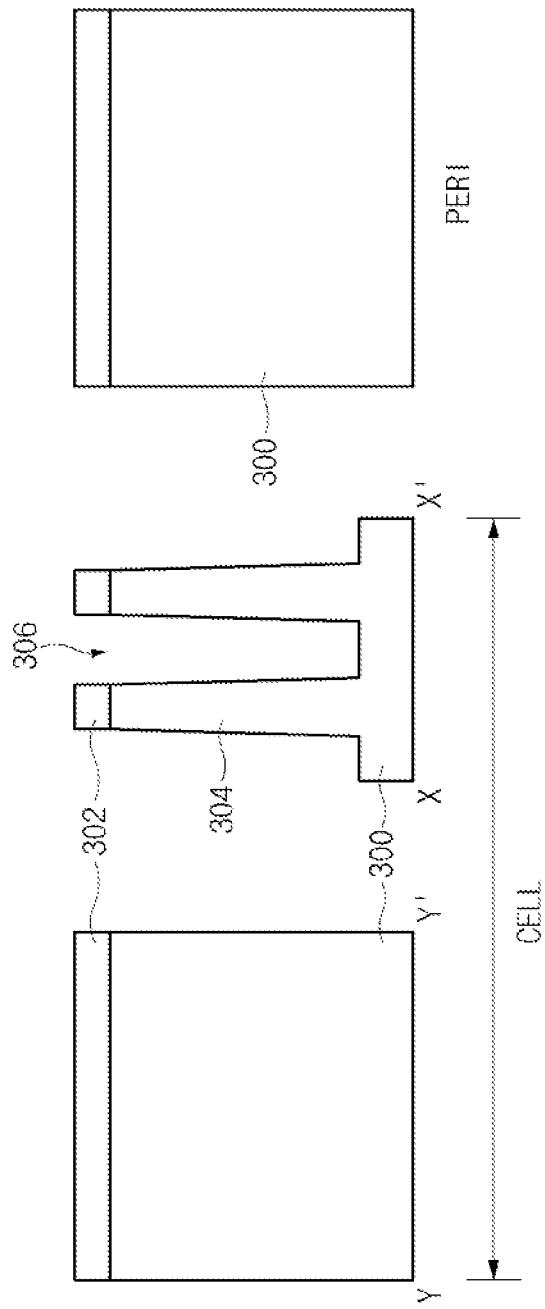

Referring to FIG. 3a, a hard mask film (not shown) is formed over a substrate 300 including a cell region and a peripheral region, and a photoresist film (not shown) is formed over the hard mask film.

After that, an exposure and development process is performed on the photoresist film so that a line-type photoresist pattern is formed over the cell region. Subsequently, the hard mask film of the cell region is etched using the photoresist pattern as an etch mask, such that a line-type hard mask pattern 302 is formed. In an embodiment, critical dimension (CD) of the hard mask pattern 302 may be substantially the same as the length of a short axis of an active region to be formed in a subsequent process.

In another embodiment, the hard mask pattern 302 may be formed through a spacer pattern technology (SPT). For example, after a first hard mask film (not shown) is formed over a second hard mask film (not shown), the first hard mask film is etched using a photoresist pattern, such that a first hard mask pattern (not shown) of a line type is formed. Subsequently, a spacer is formed on both sidewalls of the first hard mask pattern, and then the first hard mask pattern is removed. After that, the second hard mask film is etched using the spacer as an etch mask, so that the hard mask pattern 302 is formed.

After the hard mask pattern 302 is formed, the substrate 300 is etched using the hard mask pattern 302 as an etch mask in such a manner that a trench 306, which defines a line-type partition pattern 304, is formed in the cell region. After that, the hard mask pattern 302 is removed.

Figure 3B:
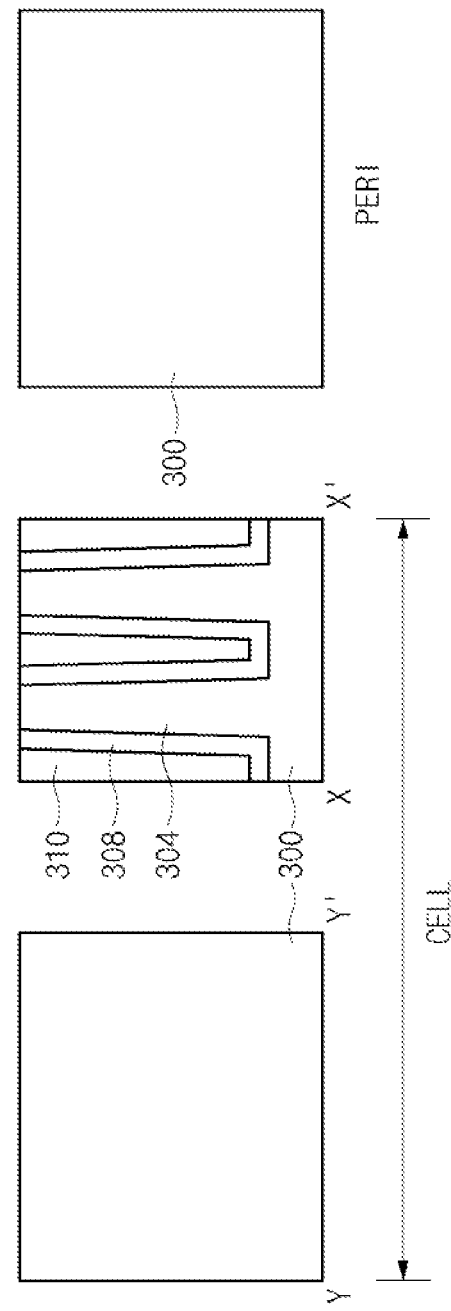

Referring to FIG. 3b, an oxide film is deposited over the cell region and the peripheral region, such that a wall oxide film 308 is formed along a bottom surface and sidewalls of the trench 306. In an embodiment, the wall oxide film 308 is formed to be thick, but is not thick enough to fill the trench 306 with an oxide film.

The wall oxide film 308 may include a high temperature oxide (HTO) film having superior step coverage, and may be formed through a chemical vapor deposition (CVD) process.

After formation of the wall oxide film 308, a dry oxidation process may be performed to cure the substrate 300 that has been damaged (or etched) in the etch process for forming the trench 306.

Subsequently, an insulation film is formed to fill the portion of the trench 306 that remains after the formation of the wall oxide film 308, and then the insulation film is planarized (or CMP-processed). As a result, a first device isolation film 310 is formed in the cell region. In an embodiment, the first device isolation film 310 includes a different material from the wall oxide film 308. In an embodiment, the first device isolation film 310 is a nitride film.

As described above, since the wall oxide film 308 is formed on the bottom and the sidewalls of the trench 306 to have a relatively large thickness, a region in which the nitride film 310 is formed is reduced in size, and thus a charge trap caused by the nitride film is improved. In addition, to prevent a retention time from being deteriorated by excessive stress, which results when the trench 306 is filled with an oxide film only, the trench 306 is filled with the wall oxide film 308 and the nitride film 310. In addition, the thickness of the wall oxide film 308 can be adjusted so that a desired amount of the nitride film 310 is inserted between the wall oxide films 308.

Figure 3C:
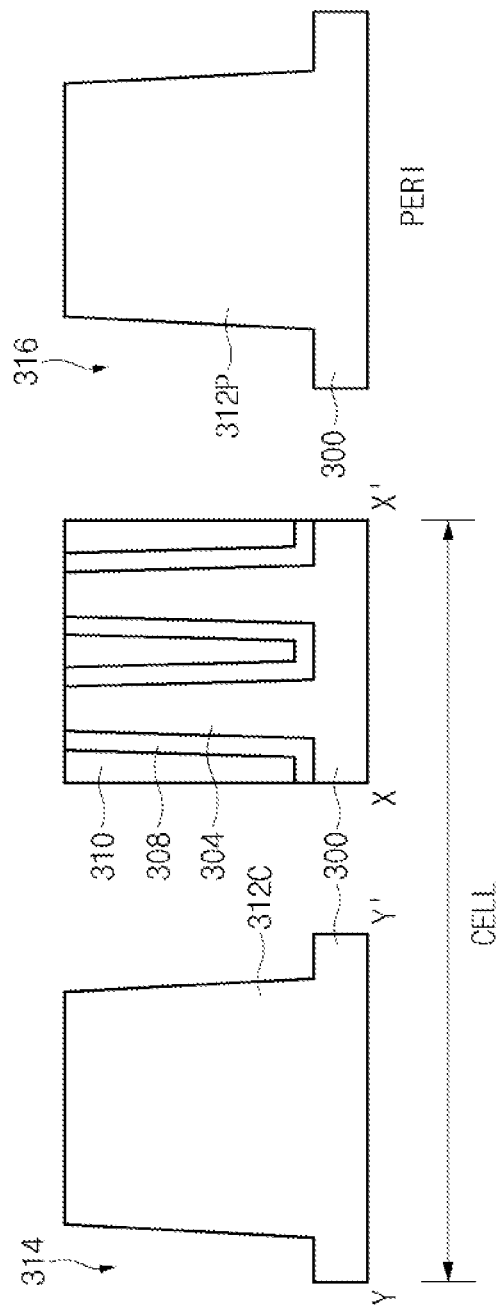

Referring to FIG. 3c, after a photoresist film (not shown) is formed over the resultant structure, including the first device isolation film 310, the wall oxide film 308, and the partition pattern 304, an exposure and development process is performed on the photoresist film to form a cut-mask pattern (not shown) and a peri-mask pattern (not shown). The cut-mask pattern is for cutting the partition pattern 304 in units of a predetermined length in the cell region and the peri-mask pattern (not shown) is for defining an active region is formed in the peripheral region. In an embodiment, the predetermined length may be substantially the same as the length of a long-axis of an active region to be formed in a subsequent process.

Thereafter, the partition pattern 304 in the cell region and the substrate 300 in the peripheral region are etched using the cut-mask pattern and the peri-mask pattern, respectively, as an etch mask. Thus, by cutting the partition pattern 304 in units of the predetermined length, a trench 314 defining an active region 312C is formed in the cell region, and a device isolation trench 316 defining an active region 312P is formed in the peripheral region.

Referring to FIG. 3d, an oxide film is deposited over the cell region and the peripheral region in which the partition pattern 304 is cut in units of the predetermined length, such that a wall oxide film 318 is formed over the bottom and sidewalls of the trenches 314 and 316. In an embodiment, the wall oxide film 318 may include an HTO film, and may be formed through CVD. The wall oxide film 318 may be formed to be thinner than the wall oxide film 308. Preferably, the wall oxide film 318 is formed to be as thin as possible.

After formation of the wall oxide film 318, a dry oxidation process may be performed to cure the substrate 300 that has been damaged in the etch process for forming the trenches 314 and 316. In this embodiment, since the wall oxide film 318 is formed to be thinner than the wall oxide film 308, the curing effect of the dry oxidation process performed after the formation of the wall oxide film 318 is greater than that of the dry oxidation process executed after the formation of the wall oxide film 308. In another embodiment, the dry oxidation process may be performed on the damaged substrate before forming the wall oxide film 318. As a result, the curing effect for the substrate damaged in the etch process during formation of the trenches 314 and 316 may be maximized.

As described above, the wall oxide film 318 is formed as thin as possible, and thus the substrate-curing effect increases, resulting in improved device characteristics.

Figure 3E:
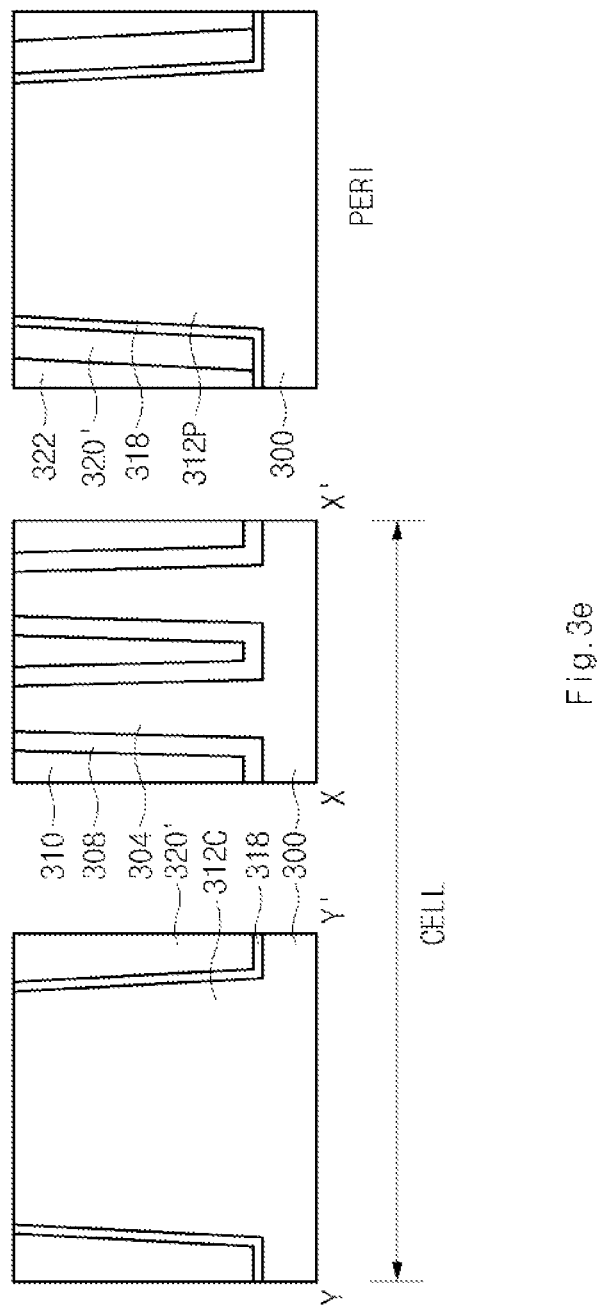

Referring to FIG. 3e, an insulation film is deposited over the cell region and the peripheral region. The insulation film fills the trenches 314 and 316, such that a second device isolation film 320 is formed in the cell region. In an embodiment, the second device isolation film 320 may include an oxide film. Since the second device isolation film 320 is formed of an oxide film and is provided in the cell region, tensile stress is applied to a channel region, and thus an operation current of a cell of the semiconductor device can be improved.

When the second device isolation film 320 is formed in the cell region, an oxide film 320' is formed to have a relatively large thickness over sidewalls of the active region 312P in the peripheral (peri) region. A wall oxide film having a stacked structure, including the oxide film 318 and the other oxide film 320', is formed over the sidewalls of the active region 312P in the peripheral region. In an embodiment, the stacked oxide films 318 and 320' formed over the sidewalls of the active region 312P in the peripheral region may be thicker than the sum of the other wall oxide films 308 and 318 formed over a sidewall of the active region 312C in the cell region. This means that the thickness of the oxide film 320' is greater than that of the wall oxide film 308.

As described above, since the oxide films 318 and 320' are formed to be thick in the peripheral region, Hot Electron Induced Punchthrough (HEIP) characteristics of a PMOS transistor can be improved. In addition, while, in the conventional art, a double-layered wall oxide film is formed by performing an additional process to form a thick wall oxide film in a peripheral region, in an embodiment in accordance with the present disclosure, the wall oxide film of the peripheral region is formed to be thick without performing additional processes.

Subsequently, an insulation film is formed to fill the portion of the trench 316 in the peripheral region that remains after forming the oxide film 320', such that a device isolation film 322 is formed in the peripheral region.

As is apparent from the above descriptions, a semiconductor device is fabricated to include a wall oxide film that has different thicknesses depending on locations of the sidewalls in an active region on which the wall oxide film is formed. As a result, disturbance caused by NG and PG can be effectively solved.

Those skilled in the art will appreciate that embodiments of the present disclosure may be carried out in ways other than those set forth herein without departing from the spirit and essential characteristics of the present embodiments. The above embodiments are therefore to be construed in all aspects as illustrative and not restrictive.

The above embodiments are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a volatile memory device or non-volatile memory device. Other additions, subtractions, or modifications are obvious in view of the present disclosure and are intended to fall within the scope of the appended claims.

What is claimed is:

1. A semiconductor device comprising:
   an active region;
   a wall oxide film disposed over the active region; and
   a device isolation film defining the active region and disposed over the wall oxide film,
   wherein the wall oxide film has different thicknesses, a thickness of the wall oxide film depending on a location along a sidewall of the active region over which the wall oxide film is disposed.

2. The semiconductor device according to claim 1, wherein the wall oxide film includes:
   a first wall oxide film disposed over a first sidewall of the active region, the first sidewall extending along a direction of a first axis of the active region, the first wall oxide film having a first thickness; and
   a second wall oxide film disposed over a second sidewall of the active region, the second sidewall extending along a direction of a second axis of the active region, the second wall oxide film having a second thickness that is different from the first thickness,
   wherein the first axis is longer than the second axis.

3. The semiconductor device according to claim 2, wherein the first thickness is greater than the second thickness.

4. The semiconductor device according to claim 2,
   wherein the device isolation film includes:
   a first device isolation film located between first wall oxide films that are disposed over sidewalls of active regions neighboring each other along a second axis direction; and
   a second device isolation film located between second wall oxide films that are disposed over sidewalls of active regions neighboring each other along a first axis direction.

5. The semiconductor device according to claim 4, wherein the first device isolation film has a line type that extends along the first axis direction of the active region.

6. The semiconductor device according to claim 4, wherein the first device isolation film includes a nitride film.

7. The semiconductor device according to claim 4, wherein the second device isolation film has an island type between active regions neighboring each other along the first axis direction of the active regions.

8. The semiconductor device according to claim 4, wherein the second device isolation film includes an oxide film.

9. The semiconductor device according to claim 2, wherein the second wall oxide film is disposed over a sidewall of the active region that is contiguous to a passing gate (PG).

10. The semiconductor device according to claim 2, wherein the active region is located in a cell region.

11. The semiconductor device according to claim 2, further comprising:
    a third wall oxide film disposed over a sidewall of an active region in a peripheral region, the third wall oxide film having a third thickness.

12. The semiconductor device according to claim 11, wherein the third thickness is greater than the sum of the first thickness and the second thickness.

13. The semiconductor device according to claim 11, wherein the third wall oxide film has a double-layered structure.

14. The semiconductor device of claim 1, wherein the active region is a first active region, and wherein the device isolation film is disposed between the first active region and a second active region.

15. A semiconductor device comprising:
an active region; and
a wall oxide film disposed over the active region,
wherein the wall oxide film has different thicknesses, a thickness of the wall oxide film depending on a location of a sidewall of the active region over which the wall oxide film is disposed,
wherein the wall oxide film includes:
   a first wall oxide film disposed over a first sidewall of the active region, the first sidewall extending along a direction of a first axis of the active region, the first wall oxide film having a first thickness; and
   a second wall oxide film disposed over a second sidewall of the active region, the second sidewall extending along a direction of a second axis of the active region, the second wall oxide film having a second thickness that is different from the first thickness, and
wherein the first axis is longer than the second axis.

* * * * *